United States Patent [19]

Stringfellow et al.

[11] 4,147,571
[45] Apr. 3, 1979

[54] METHOD FOR VAPOR EPITAXIAL DEPOSITION OF III/V MATERIALS UTILIZING ORGANOMETALLIC COMPOUNDS AND A HALOGEN OR HALIDE IN A HOT WALL SYSTEM

[75] Inventors: Gerald B. Stringfellow; Howard T. Hall, Jr., both of Palo Alto, Calif.

[73] Assignee: Hewlett-Packard Company, Palo Alto, Calif.

[21] Appl. No.: 814,247

[22] Filed: Jul. 11, 1977

[51] Int. Cl.² ................. H01L 21/205; H01L 21/322
[52] U.S. Cl. ....................... 148/175; 148/174; 156/610; 156/613; 156/614; 252/62.3 GA
[58] Field of Search ............... 148/174, 175; 156/610, 156/613, 614; 252/62.3 GA; 427/87, 252

[56] References Cited

U.S. PATENT DOCUMENTS

| 3,226,270 | 12/1965 | Miederer et al. | 148/174 |
| 3,338,761 | 8/1967 | Cheney et al. | 148/175 |
| 3,364,084 | 1/1968 | Ruehrwein | 148/175 |
| 3,721,583 | 3/1973 | Blakeslee | 148/175 X |
| 3,802,967 | 4/1974 | Ladany et al. | 148/175 X |
| 3,867,202 | 2/1975 | Ichiki et al. | 148/175 |

FOREIGN PATENT DOCUMENTS 1038946  8/1966  United Kingdom ............ 148/175

OTHER PUBLICATIONS

Rai-Choudhury et al., "Selective Growth ... Gallium Arsenide," J. Electrochem. Soc., vol. 118, No. 1, Jan. 1971, pp. 107-110.
Weiner, M. E., "Si Contamination ... GaAs and GaP." Ibid., vol. 119, No. 4, Apr. 1972, pp. 496-504.
DiLorenzo, J. V., "Vapor Growth ... GaAs ... Layers," J. Crystal Growth 17 (1972), pp. 189-206.
Pogge et al., "Doping Behavior of Silicon ... III-V ... Films."
Ibid., 31 (1975), pp. 183-189.
Enstrom et al., "Influence of Gas Phase ... GaAs P-N Junctions," J. Electrochem. Soc., vol. 121, Nov. 1974, pp. 1516-1523.

Primary Examiner—L. DeWayne Rutledge
Assistant Examiner—W. G. Saba
Attorney, Agent, or Firm—Ronald E. Grubman

[57] ABSTRACT

A process is provided for the VPE growth of III/V compounds such as $Al_xGa_{1-x}As$ in which the group III elements are transported into the reaction zone in the form of organometallic compounds in the presence of a gaseous halogen or hydrogen halide such as hydrogen chloride (HCl).

28 Claims, 5 Drawing Figures

METHOD FOR VAPOR EPITAXIAL DEPOSITION OF III/V MATERIALS UTILIZING ORGANOMETALLIC COMPOUNDS AND A HALOGEN OR HALIDE IN A HOT WALL SYSTEM

BACKGROUND OF THE INVENTION

In the electronics industry interest in $Al_xGa_{1-x}As$ has grown to the point that currently R&D efforts related to this material surpass those of all other III/V compounds and alloys. The nearly exact lattice parameter match between GaAs ($a_o=5.654$) and AlAs ($a_o=5.661$) allows the growth of lattice matched heterostructures with nearly ideal interference and direct bandgap energies covering an important range for optoelectronic devices from 1.43 to >2.0 eV. This combination of properties has allowed fabrication of such optoelectronic devices as lasers, high radiance infra-red light-emitting diodes (LEDs) for optical communication applications, visible LEDs, integrated optics elements and circuits, and high efficiency solar cells.

A number of techniques used for the growth of other III/V semiconductors have also been attempted for the growth of $Al_xGa_{1-x}As$, including liquid phase (LPE), molecular beam epitaxial growth (MBE), and vapor phase epitaxial growth (VPE). However, VPE is the technique presently used for all large-scale commercial semiconductor growth operations, including Si, $GaAs_xP_{1-x}$ and, more recently, GaP. The vapor phase process exhibits excellent control of thickness, composition (for $GaAs_xP_{1-x}$ alloys) and doping level, and is generally superior to LPE in the areas of morphology and defect control. Another advantage of VPE (which would be particularly useful for $Al_xGa_{1-x}As$ structures) is the ease with which composition or doping level can be altered by simply changing the flow rate of the appropriate gas or gases during the growth cycle. Effects such as an intentional taper in composition or doping level which are impossible by LPE are thereby routinely achieved in VPE.

Inspired by the many possible advantages of VPE for growth of $Al_xGa_{1-x}As$, workers in the field have attempted to apply VPE techniques previously used for other III/V compounds and alloys to the $Al_xGa_{1-x}As$ system. Thus, chloride transport of Al and Ga in a VPE system has been attempted, but these efforts have been reported as unsuccessful for a variety of reasons, some of which are: (1) Substrate temperatures of over 1000° C. were necessary to grow single crystalline layers of AlAs on GaAs substrates; (2) Even at these high temperatures, predeposition of AlAs (i.e., deposition on the crucible walls upstream from the substrate) hindered deposition on the substrate. Efforts to avoid predeposition resulted in insufficient mixing of the gases prior to deposition; (3) The resulting epitaxial layers were found to be pure AlAs substrate temperatures of >1000° C. and pure GaAs for lower substrate temperatures; (4) AlCl was found to severely attack the fused $SiO_2$ typically used for reactor walls, thus destroying the apparatus and causing high Si doping in the epilayers; and (5) Oxidation of the metallic Al, with which HCl reacts to form AlCl, was found to totally prevent growth unless many Al boats were arranged in series to allow oxygen to be removed from the gas stream by the earlier boats to prevent an oxide skin from forming on the final boats in the series. Because of these problems no successful growth of $Al_xGa_{1-x}As$ alloys by chloride transport has been reported to date.

Another approach which has been somewhat more successful has been the growth of $Al_xGa_{1-x}As$ using volatile organometallic Al and Ga compounds to transport the metals into the reaction zone of a cold-wall reactor. Very little work has been reported in this area, but early results indicate that lower temperature growth is possible with excellent control of both alloy composition and morphology. However, $Al_xGa_{1-x}As$ grown in this manner is highly contaminated by carbon which acts to compensate the material (i.e., the ratio $(N_D+N_A)/(N_D-N_A)$ becomes large) resulting in high resistivity. More importantly, such material exhibits extremely low photoluminescence (PL) intensity, presumably due to the introduction of non-radiative recombination centers.

No attempts to use organometallics for growth of III/V materials in hot-wall systems have been reported. The known predelection of metal alkyls, especially aluminum alkyls, to decompose homogeneously into carbides and metal-alkyl polymers, as widely reported in the literature on metallization, has discouraged this approach. Experiments performed by the present inventors in a hot-wall system using $AsH_3$ and organometallics of gallium and aluminum have indeed shown extensive formation of $Al_4C_3$ in the inlet regions, along with formation of a fine solid powder. No epitaxial growth was achieved.

Other work of some relevance to the present invention was reported by K. Kindeke, W. Sack, and J. J. Nick in J. Electrochem. Soc. 117, (Oct. 1970) and Y. Nakayama, S. Ohkawa, H. Hashimoto, and H. Ishikawa in J. Electrochem. Soc. 123, 1227 (1976) in which an organometallic halide ($Ga(C_2H_5)_2Cl$) was introduced to grow GaAs by a cold-wall VPE deposition process. H. Manasevit and W. Simpson reported in J. Electrochem. Soc. 116, 1725 (Dec. 1969) an unsuccessful attempt to grow GaAs in a cold-wall system by introducing trimethylgallium (TMG) and gaseous $AsCl_3$. In none of this work was there any suggestion of introducing gaseous halogens or hydrogen halides (as will be discussed below) into the systems which were investigated, nor did any of this work apply to the $Al_xGa_{1-x}As$ system in particular.

SUMMARY OF THE INVENTION

In accordance with the illustrated preferred embodiment and examples, the present invention provides for the VPE growth of III/V compounds such as $Al_xGa_{1-x}As$ in which the group III elements are transported into the reaction zone in the form of organometallic compounds in the presence of a gaseous halogen or hydrogen halides such as hydrogen chloride (HCl).

The new process has application in cold-wall systems where it greatly enhances the growth rate of $Al_xGa_{1-x}As$, particularly when organometallics are used in which organic groups with more than one carbon are involved. Such higher alkyls are desirable because of their known decreased propensity for metal carbide formation upon decomposition, with attendant decreased carbon incorporation in the growth layer.

The process also has application in hot-wall systems in which the confining walls of the growth system are intentionally heated to temperatures approaching or exceeding that of the substrate. Use of hot-wall systems for $Al_xGa_{1-x}As$ growth has hitherto not been successful either with chloride transport systems or with organometallic processes as discussed above. However, the addition of halogen or hydrogen halide such as HCl to the organometallic hot-wall process produces effective deposition of high-quality uncompensated $Al_xGa_{1-x}As$ exhibiting a high degree of photoluminescence.

DETAILED DESCRIPTION OF THE INVENTION

Figure 1:
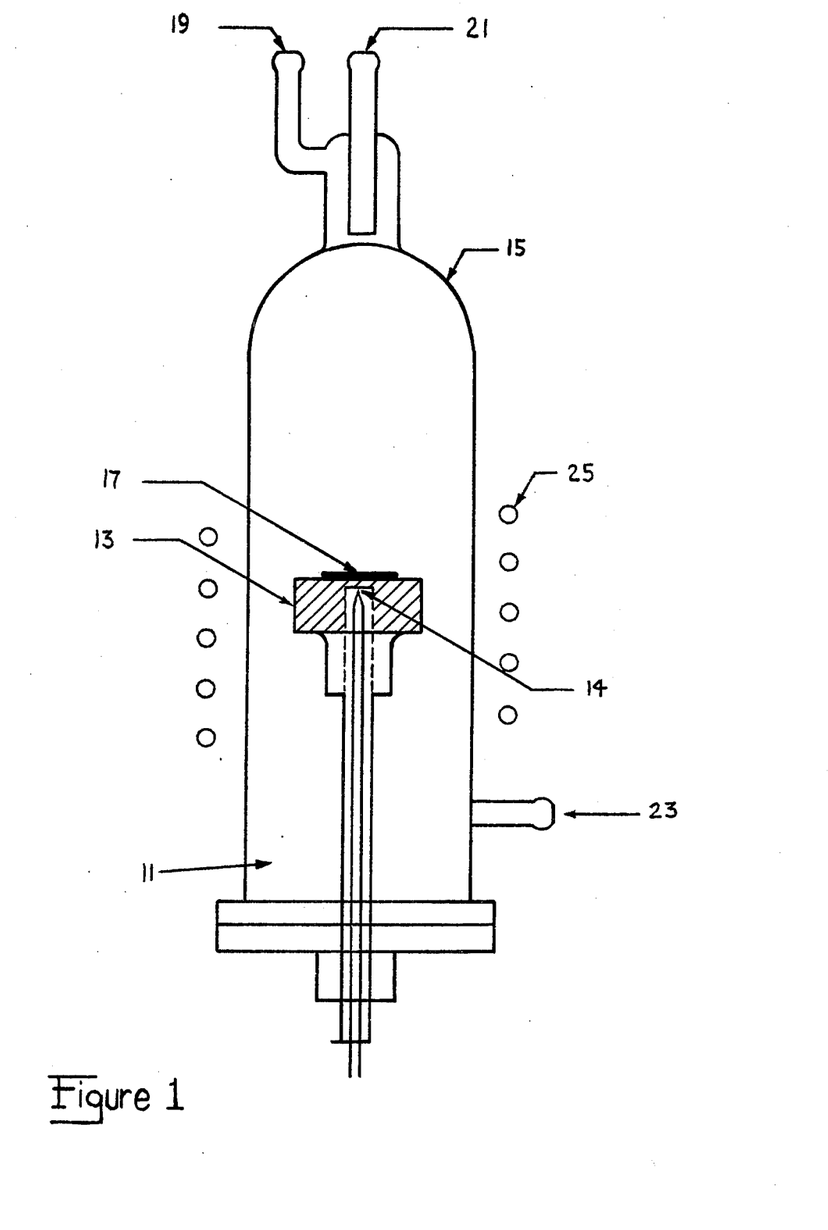
FIG. 1 is a schematic diagram of a reactor for cold-wall growth of $Al_xGa_{1-x}As$.

In FIG. 1 there is shown a reactor 11 of the type commonly used for VPE growth of semiconductor materials. Reactor 11 is here a cold-wall reactor in which a pedestal 13, typically of graphite, is heated (e.g., by RF induction heating) and controlled via a thermocouple 14. The reactor wall 15, typically of $SiO_2$ remains cool.

A semiconductor substrate 17 on which epitaxial growth is to occur rests on pedestal 13. Substrate 17 is of a material suitable for epitaxial growth thereon, many such now being known in the art. For example, III/V compounds have been epitaxially grown on substrates of: III/V materials, Si, Ge, and insulators such as sapphire and spinel. Gases are inputted to reactor 11 through entry ports 19 and 21, and exhausted through an exhaust port 23. A heating coil 25 establishes the overall temperature of the reactor.

EXAMPLE 1

The cold-wall reactor of FIG. 1 was heated by coil 25 to 690° C. A first gas stream containing 2.45 sccm Ga$(C_2H_5)_3$ (triethylgallium, hereinafter referred to as TEG), 0.25 sccm $Al(CH_3)_3$ (trimethylaluminum, hereinafter referred to as TMA), and 1200 sccm $H_2$ was introduced through port 21. A second gas stream containing 9.7 sccm $AsM_3$, 1.22 sccm HCl and 2000 sccm $H_2$ was introduced through port 19. After 20 minutes of growth a specular, single crystal layer of $(Al_xGa_{1-x})As$, with $x=0.09$ and a thickness of 7.1 micrometers was obtained. The above growth rate is about ten times the rate observed under identical conditions using triethylgallium (TEG) without addition of HCl, and compares to cold-wall growth rates using trimethylgallium (TMG), a less desirable reactant.

EXAMPLE 2

Figure 2:
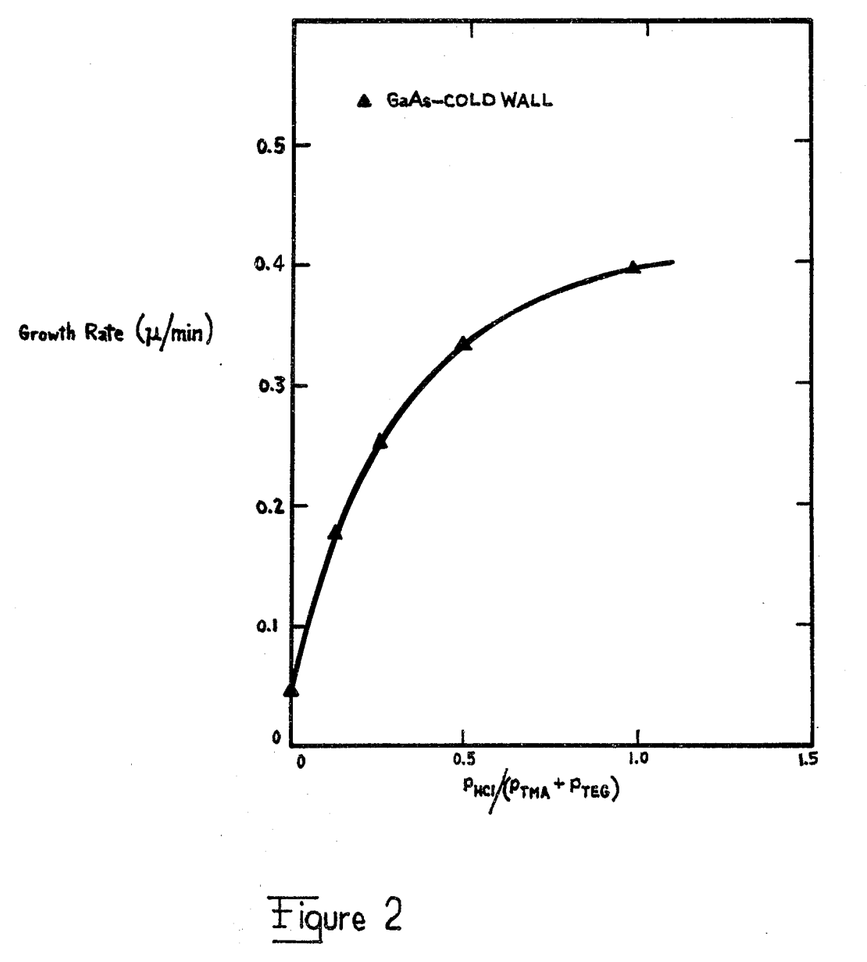
FIG. 2 shows the growth rate of $Al_xGa_{1-x}As$ rate versus the ratio of HCl to metal alkyl in the input gas stream.

To determine the effect of HCl on growth rate, the conditions of example 1 were repeated, except that the HCl flow was decreased in four steps from 2.4 to 0.30 sccm (10 minutes each). In FIG. 2 the growth rate is plotted versus the ratio (measured in terms of partial pressures) of HCl to total metal alkyls in the input gas stream. (The zero HCl growth rate point represents the average of several separate runs.) It is thereby demonstrated that only small amounts of HCl are needed to significantly increase the growth rate in the cold-wall system. A process according to the invention thereby enables rapid cold-wall VPE growth of $Al_xGa_{1-x}As$ using the more desirable TEG reactant.

EXAMPLE 3

The cold-wall reactor of FIG. 1 was heated by coil 25 to 770° C. A first gas stream containing 2.15 sccm TEG, 0.29 sccm TMA, and 1500 sccm $H_2$ was introduced through port 21. A second gas stream containing 9.7 sccm $AsH_3$, 2.45 sccm HCl, and 1000 sccm $H_2$ was introduced through port 19. After fifteen minutes of growth a specular, single crystal layer of $(Al_xGa_{1-x})As$, with $x=0.46$ and a thickness of 4.3 micrometers was obtained.

EXAMPLE 4

The cold-water reactor of FIG. 1 was heated by coil 25 to 690° C. A first gas stream containing 0.48 sccm TEG, 2.0 sccm TMA and 1500 sccm $H_2$ was introduced through port 21. A second gas stream containing 9.7 sccm $AsH_3$, 1.22 sccm HCl, and 1400 sccm $H_2$ was introduced through port 19. After 20 minutes of growth a specular, single crystal layer of $(Al_xGa_{1-x})As$, with $x=0.79$ and a thickness of 10.0 micrometers was obtained.

EXAMPLE 5

To demonstrate the applicability of the invention to growth of multiple-layer structures, the conditions of Example 1 were repeated, with the following changes:

The total alkyl flow was maintained at 2.45 sccm, but the TEG and TMA flows were separately varied to provide the following mole fractions of TMA in the gas phase: 0.35, 0.0, 0.05, 0.0, 0.50, 0.0, 0.1, 0.0, 0.65, 0.0, 0.15, 0.0, 0.80, 0.0, 0.25, 0.0, and 1.0. Each $(Al_xGa_{1-x})$ growth cycle was for 2 minutes. At the end of each $(Al_xGa_{1-x})$ growth step the TMA and HCl were vented, and GaAs was grown for 5 minutes with a TEG flow of 2.45 sccm. Venting of HCl provided reduced growth rate of GaAs; the average GaAs layer thickness was $0.4\mu$, with a growth rate of 0.08 $\mu$/min. In this manner, a 17-layer structure of total thickness $14.3\mu$ was obtained, with X (as determined by Auger spectroscopy) as follows: 0.50, 0.0, 0.09, 0.0, 0.68, 0.0, 0.19, 0.0, 0.81, 0.0, 0.23, 0.0, 0.87, 0.0, 0.39, 0.0, 1.00. The growth rate in the $(Al_xGa_{1-x})$ layer varied from 0.28 $\mu$/min ($x=0.09$) to 1.16 $\mu$/min ($x=1.0$).

Figure 3:
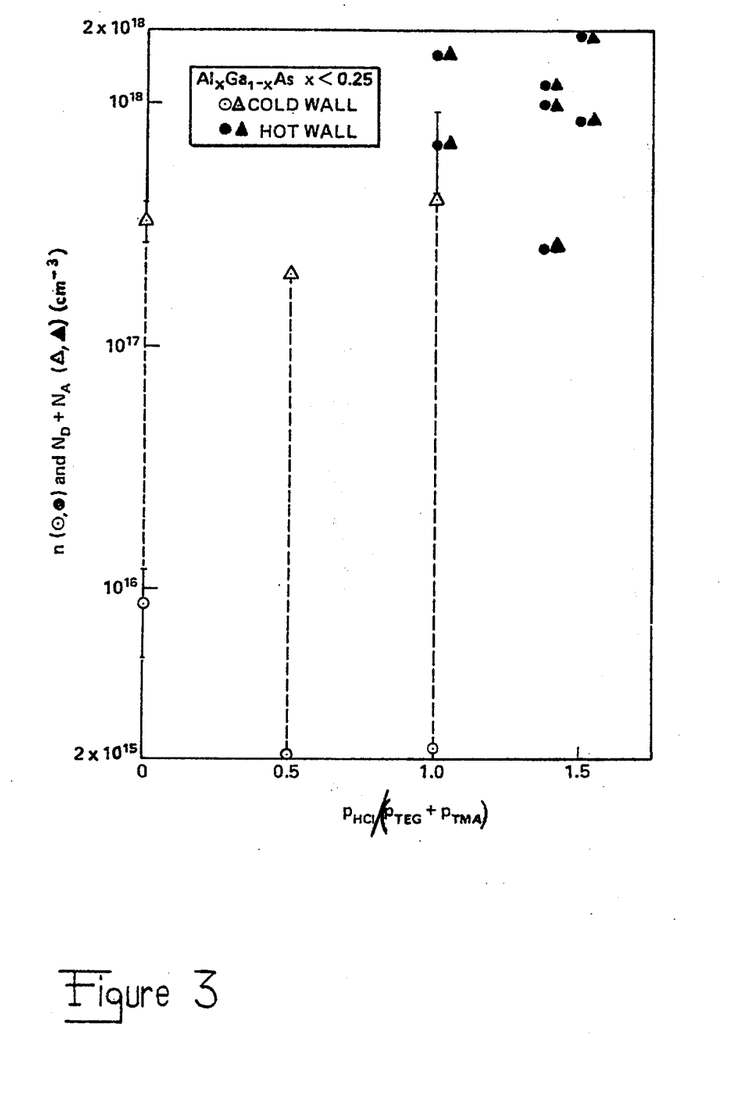
FIG. 3 shows n and $N_D+N_A$ versus HCl to metal alkyl ratio in the input gas stream for $Al_xGa_{1-x}As$.

$Al_xGa_{1-x}As$ grown as described in Example 1 was tested for its electrical properties. These tests produced some results contrary to certain expectations; in particular, it is known that in $Al_xGa_{1-x}As$ grown in cold-wall VPE systems using organometallics but without HCl, carbon is incorporated as an impurity into the lattice structure, thereby increasing the compensation ratio $(N_D+N_A/N_D-N_A)$ and also reducing or preventing photoluminescence (PL). The addition of HCl (which is known to cleave to the Al—$CH_3$ bond) might therefore be expected to cause replacement of $CH_3$ with Cl and thereby prevent incorporation of the carbon into the lattice. However, measured electrical properties of the $Al_xGa_{1-x}As$ grown as in Example 1 indicate that no change in compensation occurs. This is shown in FIG. 3, where n (defined as $N_D-N_A$) is plotted versus the ratio of HCl to metal alkyl in the input vapor phase. Data from the cold-wall system with HCl are plotted as open circles and connected by a broken line to the value of $N_D+N_A$. The PL of the $Al_xGa_{1-x}As$ layers was found to be undetectable. Thus, at the present time cold-wall growth incorporating the principles of the invention appears to be most suitable for applications such as optical windows or carrier confinement layers in some multi-layer semiconducting devices in which the $Al_xGa_{1-x}As$ is not required to exhibit electroluminescence or be otherwise electrically active.

Figure 4:
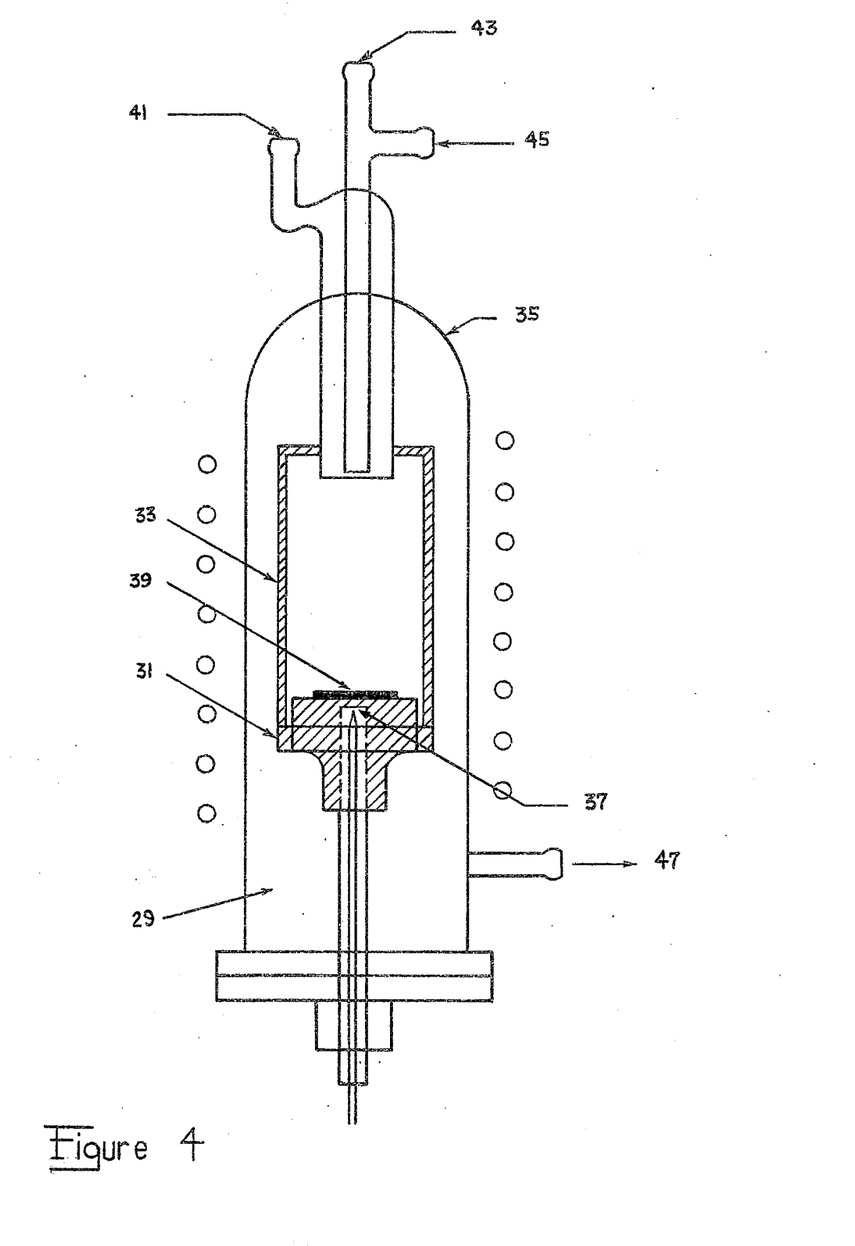
FIG. 4 is a schematic diagram of a hot-wall reactor for VPE growth of $Al_xGa_{1-x}As$.

A different and surprising result is obtained by applying the principles of the invention to growth of $Al_xGa_{1-x}As$ by VPE in a hot-wall system using organometallics to introduce the Al and Ga. The system employed is shown in FIG. 4, in which a hot-wall type reactor 29 includes a pedestal 31 (e.g., of graphite) supporting a cylindrical susceptor 33. The pedestal susceptor assembly is supported within an envelope 35 and heated (e.g., by RF induction heating) to a desired temperature controlled by a thermocouple 37. A semiconductor substrate 39 on which epitaxial growth is to occur rests in pedestal 31. Gases are directed into the susceptor region through entry ports 41, 43 and 45 and are exhausted through an exhaust port 47.

EXAMPLE 6

Figure 5:
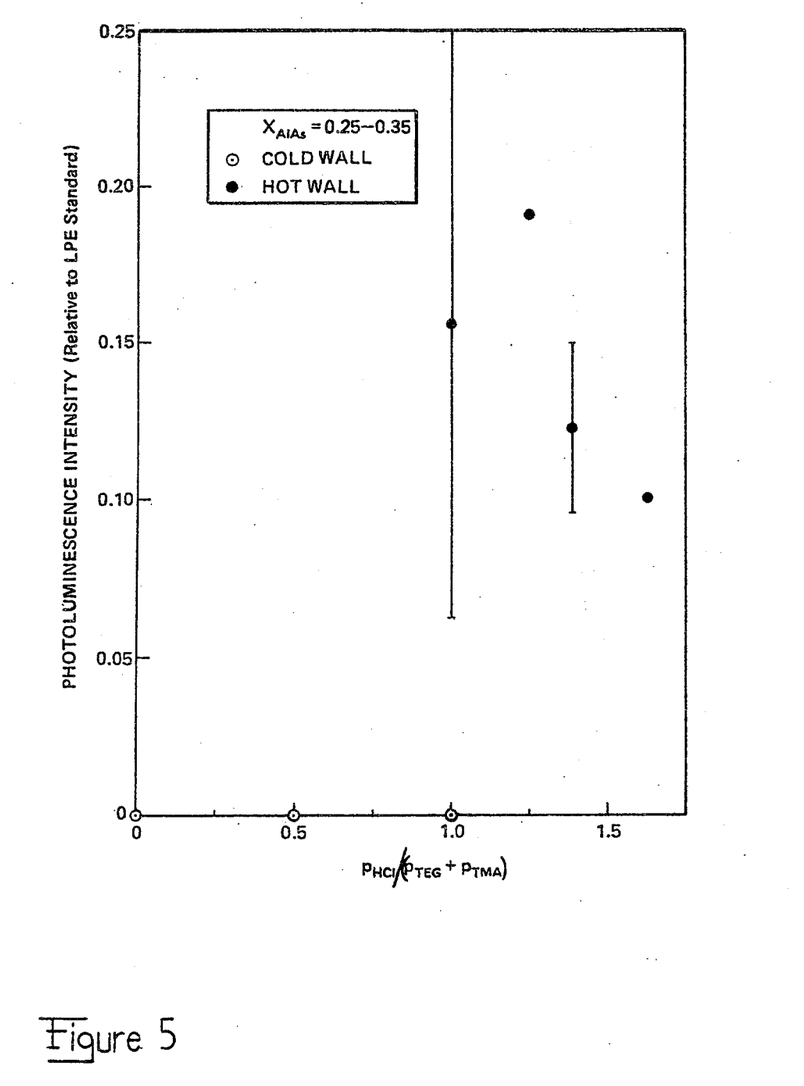
FIG. 5 shows the photoluminescence intensity versus HCl/metal-alkyl ratio in the input gas stream, measured relative to that of an LPE standard with $x=0.30$ and $n=3\times 10^{17} cm^{-3}$.

The region within susceptor 33 was heated to produce a maximum temperature of about 820° C. and a pedestal temperature of 736° C. A first gas stream containing 2.5 sccm $AsH_3$ and 1000 sccm $H_2$ was introduced through port 41. A second gas stream including 1.6 sccm TEG, 0.88 sccm TMA and 1200 sccm $H_2$ was introduced through port 43. Additionally, 3.4 sccm HCl was introduced through port 45. After 70 minutes of growth, a specular, single crystal layer of $(Al_xGa_{1-x})As$ (x=0.30) was obtained with a thickness of 7.8 micrometers. Growth rates in the hot-wall system range from 0.05 to 1.0 $\mu$/min. FIG. 3 indicates that the compensation of carrier concentration is largely eliminated. Strong PL of the grown $Al_xGa_{1-x}As$ layers was obtained. The levels shown in FIG. 5 are about 10–20% of the intensity of LPE material of similar composition and doping level.

EXAMPLE 7

The region within susceptor 33 was heated to produce a maximum temperature of about 860° C. and a pedestal temperature of 770° C. A first gas stream containing 1.7 sccm $AsH_3$ and 500 sccm $H_2$ was introduced through port 41. A second gas stream including 2.2 sccm TEG, 0.30 sccm TMA and 1500 sccm $H_2$ was introduced through port 43. Additionally, 2.5 sccm HCl was introduced through port 45. After 20 minutes of growth, a specular, single crystal layer of $(Al_xGa_{1-x})As$ (x=0.45) was obtained with a thickness of 3.2 micrometers.

EXAMPLE 8

To demonstrate the broad temperature range over which growth is possible with the invention, five layers were grown, for 20 minutes each, without any interruption of flow, by varying the substrate temperature as follows: 850° C., 800° C., 750° C., 700° C. and 650° C. The maximum temperature on the graphite susceptor 33 was, correspondingly, 990° C., 930° C., 865° C., 800° C. and about 750° C. All flows were the same as in example 5. The layer thicknesses were 1.6, 1.6, 1.8, 3.6 and 3.5$\mu$, respectively, with X (determined by electron microprobe) of approximately 0.70, 0.62, 0.45, 0.12 and 0.02, respectively. Surface morphology was specular; cross-sectioning and etching showed a smooth interface between each layer, indicating absence of any gross crystalline defects.

EXAMPLE 9

The region within susceptor 33 was heated to produce a maximum temperature of about 930° C., with the pedestal maintained at 740° C. A first gas stream containing 1.72 sccm $AsH_3$ and 500 sccm $H_2$ was introduced through port 41. A second gas stream including 1.6 sccm TEG, 0.88 sccm TMA and 480 sccm $H_2$ was introduced through port 43. Additionally, 3.4 sccm HCl was introduced through port 45. After 15 minutes of growth, the $H_2$ flow through port 43 was increased to 2500 sccm and growth was continued an additional 15 minutes. The growth rate remained constant at 0.15$\mu$/min, but X increased from 0.14 in the first layer to 0.70 in the second, thereby providing a high band gap "window" layer for luminescense from the x=0.14 layer. Thus, by changing the total flow, X can be readily controlled over a broad range without any adjustment to the other flows.

EXAMPLE 10

The region within susceptor 33 was heated to produce a maximum temperature of about 860° C., and a pedestal temperature of 736° C. A first gas stream containing 2.5 sccm $AsH_3$ and 1700 sccm $H_2$ was introduced through port 41. A second gas stream including 1.6 sccm TEG, 0.88 sccm TMA and 500 sccm $H_2$ was introduced through port 43.

Additionally, 3.4 sccm HCl was introduced through port 45. After 20 minutes of growth, 0,27 sccm of diethyl zinc (DEZ) was added to the TEG and TMA flow stream, and growth was continued for twenty more minutes. A specular double-layer with x=0.30 and total thickness of 2.8$\mu$ each was obtained; the bottom layer (t=1.4$\mu$) had n-type doping of $2\times10^{18}$; the top layer was p-type, with $n=3\times10^{18}$. Mesa-type LED's were fabricated from this structure which gave red electroluminescence at $\lambda=6740Å$.

The surprising and interesting result of the above examples is that while neither organometallic nor chloride transport hot-wall VPE processes have heretofore achieved satisfactory growth of $Al_xGa_{1-x}As$, the introduction of gaseous HCl into a hot-wall system along with organometallics of Al and Ga yields high quality $Al_xGa_{1-x}As$ displaying sufficient PL for application in optoelectronic devices. Based on increased growth rates and suppression of carbon incorporation already achieved, it is believed that the invention may have application for VPR growth using other organometallics of Al and Ga as well as other metal alkyls such as trimethyl indium in various ternary, quaternary and other III/V compounds and alloys.

We claim:
1. A process for the preparation of III/V semiconductor materials comprising the steps of:
    (a) positioning in a reaction chamber a substrate of a material suitable for epitaxial growth of III/V compounds thereon;
    (b) introducing into said reaction chamber a gaseous mixture including at least one organometallic compound of a group III element, at least one compound of a group V element, one of a hydrogen halide and a halogen, and hydrogen;
    (c) heating said reaction chamber walls to a temperature in the range 750° C. to 1000° C., and heating said substrate to a temperature in the range 650° C. to 850° C.; and (d) depositing on said substrate an epitaxial layer of a III/V compound of said group III and group V elements.

2. A process as in claim 1 wherein:
said one of a hydrogen halide and a halogen comprises HCl.

3. A process as in claim 1 wherein:
said group II element is Al; and
said III/V compound is AlAs.

4. A process as in claim 3 wherein:
said organometallic compound is Al(CH$_3$)$_3$.

5. A process as in claim 4 wherein:
said one of a hydrogen halide and a halogen comprises HCl.

6. A process as in claim 1 wherein:
said group III element is Ga; and
said III/V compound is GaAs.

7. A process as in claim 6 wherein:
said organometallic compound is Ga(C$_2$H$_5$)$_3$.

8. A process as in claim 7 wherein:
said one of a hydrogen halide and a halogen comprises HCl.

9. A process as in claim 1 wherein:
said at least one organometallic compound of a group III element includes a first organometallic compound of a first group III element and a second organometallic compound of a second group III element.

10. A process as in claim 9 wherein:
said one of a hydrogen halide and a halogen comprises HCl.

11. A process as in claim 10 wherein:
said first group III element is Al;
said second group III element is Ga;
said III/V compound is Al$_x$Ga$_{1-x}$As where X is in the range $0<x<1$.

12. A process as in claim 11 wherein:
said first organometallic compound is Al(CH$_3$)$_3$.

13. A process as in claim 12 wherein:
said second organometallic compound is Ga(C$_2$H$_5$)$_3$.

14. A process as in claim 13 wherein:
said one of a hydrogen halide and a halogen comprises HCl.

15. A process as in claim 1 wherein:
said substrate is of a III/V material.

16. A process as in claim 15 wherein:
said one of a hydrogen halide and a halogen comprises HCl.

17. A process as in claim 15 wherein:
said group III element is Al; and
said III/V compound is AlAs.

18. A process as in claim 17 wherein:
said organometallic compound is Al(CH$_3$)$_3$.

19. A process as in claim 18 wherein:
said one of a hydrogen halide and a halogen comprises HCl.

20. A process as in claim 15 wherein:
said group III element is Ga; and
said III/V compound is GaAs.

21. A process as in claim 20 wherein:
said organometallic compound is Ga(C$_2$H$_5$)$_3$.

22. A process as in claim 21 wherein:
said one of a hydrogen halide and a halogen comprises HCl.

23. A process as in claim 15 wherein:
said at least one organometallic compound of a group III element includes a first organometallic compound of a first group III element and a second organometallic compound of a second group III element.

24. A process as in claim 23 wherein:
said one of a hydrogen halide and a halogen comprises HCl.

25. A process as in claim 23 wherein:
said first group III element is Al;
said second group III element is Ga;
said III/V compound is Al$_x$Ga$_{1-x}$As where X is in the range $0<x<1$.

26. A process as in claim 25 wherein:
said second organometallic compound is Al(CH$_3$)$_3$.

27. A process as in claim 26 wherein:
said second organometallic compound is Ga(C$_2$H$_5$)$_3$.

28. A process as in claim 27 wherein:
said one of a hydrogen halide and a halogen comprises HCl.

* * * * *

UNITED STATES PATENT AND TRADEMARK OFFICE
CERTIFICATE OF CORRECTION

PATENT NO. : 4,147,571                           Page 1 of 2
DATED : April 3, 1979
INVENTOR(S) : Gerald B. Stringfellow & Howard T. Hall, Jr.

It is certified that error appears in the above-identified patent and that said Letters Patent are hereby corrected as shown below:

Column 1, line 14, delete "interference" and insert --interfaces--;

Column 1, line 56, after "AlAs" insert --for--;

Column 2, line 60, delete "growth" and insert --grown--;

Column 3, line 48, delete "AsM$_3$" and insert --AsH$_3$--;

Column 4, line 66, delete "value" and insert --values--;

Column 6, line 33, delete "0,27" and insert --0.27--;

Column 6, line 41, delete "6740A" and insert --6740Å--;

UNITED STATES PATENT AND TRADEMARK OFFICE
CERTIFICATE OF CORRECTION

PATENT NO. : 4,147,571
DATED : April 3, 1979
INVENTOR(S) : Gerald B. Stringfellow & Howard T. Hall, Jr.

It is certified that error appears in the above-identified patent and that said Letters Patent are hereby corrected as shown below:

Column 6, line 52, delete "VPR" and insert --VPE--;

Column 7, line 11, delete "II" and insert --III--;

Column 7, line 39, delete "X" and insert --x--; and

Column 8, line 36, delete "X" and insert --x--.

Signed and Sealed this

Thirty-first Day of July 1979

[SEAL]

Attest:

*Attesting Officer*

LUTRELLE F. PARKER
*Acting Commissioner of Patents and Trademarks*